United States Patent
Kaneda et al.

(10) Patent No.: US 8,436,352 B2
(45) Date of Patent: May 7, 2013

(54) SEMICONDUCTOR INTEGRATED CIRCUIT

(75) Inventors: Yoshinobu Kaneda, Ora-gun (JP); Koji Ishida, Ora-gun (JP)

(73) Assignee: ON Semiconductor Trading, Ltd., Hamilton (BM)

( * ) Notice: Subject to any disclaimer, the term of this patent is extended or adjusted under 35 U.S.C. 154(b) by 216 days.

(21) Appl. No.: 13/156,681

(22) Filed: Jun. 9, 2011

(65) Prior Publication Data

US 2011/0315986 A1 Dec. 29, 2011

(30) Foreign Application Priority Data

Jun. 24, 2010 (JP) ................. 2010-143488

(51) Int. Cl.
*H01L 23/58* (2006.01)

(52) U.S. Cl.
USPC ............ 257/48; 257/235; 257/414; 257/415; 257/E23.002; 257/E23.194; 361/1; 361/88; 361/94

(58) Field of Classification Search ............ 257/48, 257/213, 235, 239, 249, 288, 415, 414, 417, 257/536, 684, 707, E29.324, E23.002, E23.194; 361/1, 88, 94

See application file for complete search history.

(56) References Cited

U.S. PATENT DOCUMENTS

| | | | |
|---|---|---|---|
| 7,247,921 B2 * | 7/2007 | Sugiura et al. | 257/494 |
| 7,649,200 B1 * | 1/2010 | Miller et al. | 257/48 |
| 2008/0035923 A1 * | 2/2008 | Tschmelitsch et al. | 257/48 |

FOREIGN PATENT DOCUMENTS

JP 2000-188305 7/2000

* cited by examiner

*Primary Examiner* — Eduardo A Rodela

(74) *Attorney, Agent, or Firm* — Morrison & Foerster LLP

(57) ABSTRACT

Whether there is a defect such as chipping of a die or separation of a resin in a wafer level package is electrically detected. A peripheral wiring is disposed along four peripheries of a semiconductor substrate outside a circuit region and pad electrodes P1-P8. The peripheral wiring is formed on the semiconductor substrate and is made of a metal layer that is the same layer as or an upper layer of a metal layer forming the pad electrodes P1-P8, or a polysilicon layer. A power supply electric potential Vcc is applied to a first end of the peripheral wiring, while a ground electric potential Vss is applied to a second end of the peripheral wiring through a resistor R2. A detection circuit is connected to a connecting node N1 between the peripheral wiring and the resistor R2, and is structured to generate an anomaly detection signal ERRFLG based on an electric potential at the connecting node N1.

8 Claims, 6 Drawing Sheets

SEMICONDUCTOR INTEGRATED CIRCUIT

CROSS-REFERENCE OF THE INVENTION

This application claims priority from Japanese Patent Application No. 2010-143488, the content of which is incorporated herein by reference in its entirety.

BACKGROUND OF THE INVENTION

1. Field of the Invention

This invention relates to a semiconductor integrated circuit using a wafer level package.

2. Description of the Related Art

In recent years, the wafer level package (hereafter referred to as a WLP) is in widespread use. The WLP is a general name for a package that has a size equivalent to a die size housed in it, and is directed to realizing high density packaging. It is also called a chip size package.

In general, the WLP is manufactured at a semiconductor fab, and is shipped to a module fab after a pre-shipment test. Various kinds of electronic components including the WLP are mounted onto a circuit board to manufacture various kinds of modules at the module fab. The modules manufactured there are shipped to end customers after their circuit functions are tested.

Technologies mentioned above are disclosed in Japanese Patent Application Publication No. 2000-188305, for example.

The WLP is more vulnerable to mechanical damage in handling or in mounting it onto the circuit board compared with a resin mold package. Potential defects resulting from the damage are chipping or cracking of the die, separation of a resin covering a surface of the die and the like, which are prone to be caused in a periphery of the die.

However, the WLP having the defect such as the chipping or cracking of the die or the separation of the resin may pass the circuit function test at the module fab in some cases, depending on a location or a degree of the defect. Therefore, the module in which the WLP having the defect is mounted may be shipped to the end customer, and a failure in quality may be caused there.

This invention is directed to controlling so that the WLP having the defect as described above is prevented from being shipped.

SUMMARY OF THE INVENTION

This invention provides a semiconductor integrated circuit having a semiconductor substrate, a circuit region formed in a surface of the semiconductor substrate, a pad electrode formed on the surface of the semiconductor substrate and connected with a circuit in the circuit region, a re-distribution wiring formed on the surface of the semiconductor substrate and connected to the pad electrode, a resin layer formed on the surface of the semiconductor substrate to cover the re-distribution wiring, a protruded electrode connected to the re-distribution wiring through an opening in the resin layer, a peripheral wiring disposed along a periphery of the semiconductor substrate outside the circuit region and having a first end to which a first electric potential is applied and a second end, a resistor connected between the second end of the peripheral wiring and a second electric potential, and a detection circuit generating an anomaly detection signal based on an electric potential at a connecting node between the peripheral wiring and the resistor.

DETAILED DESCRIPTION OF THE INVENTION

[First Embodiment]

Figure 1:
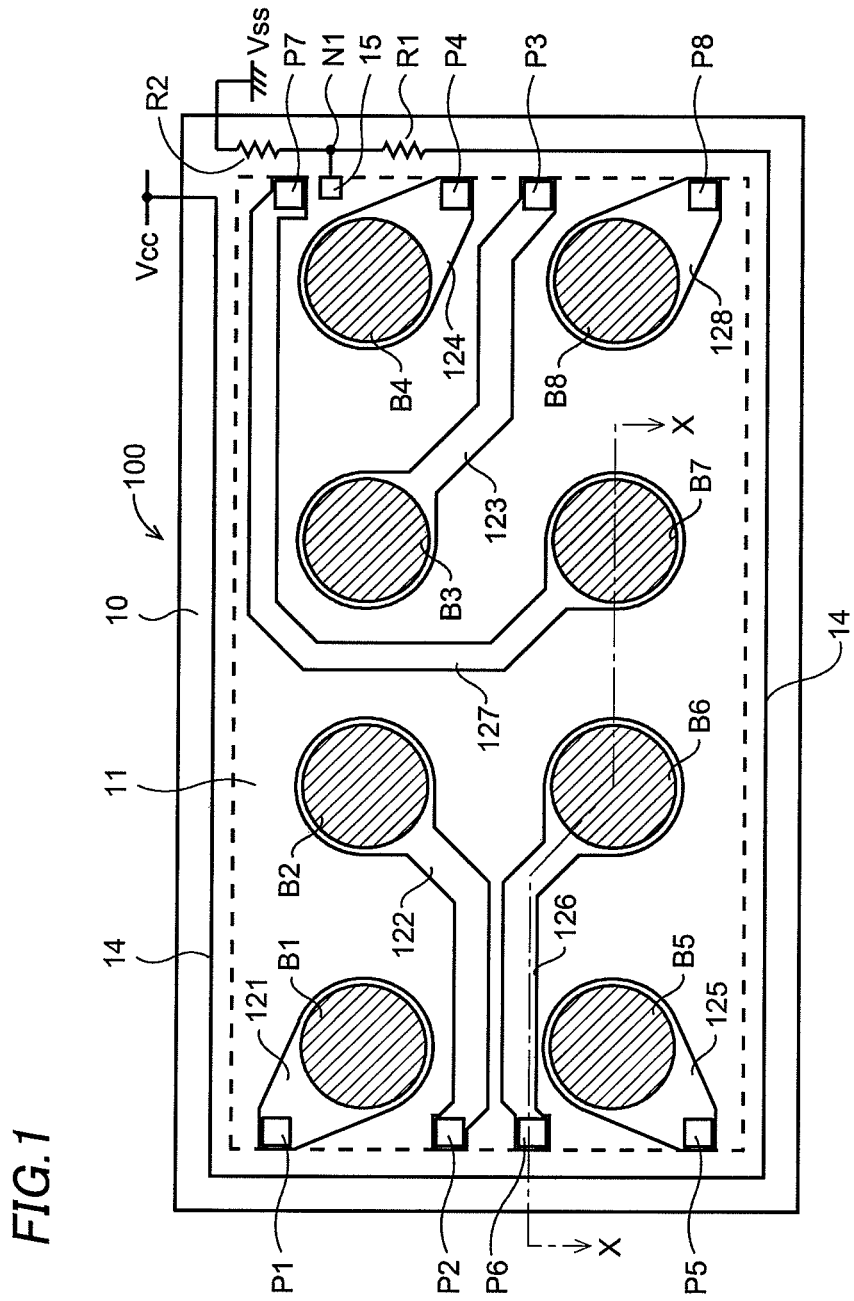
FIG. 1 is a plan view showing a semiconductor integrated circuit according to a first embodiment of this invention.
Figure 2:
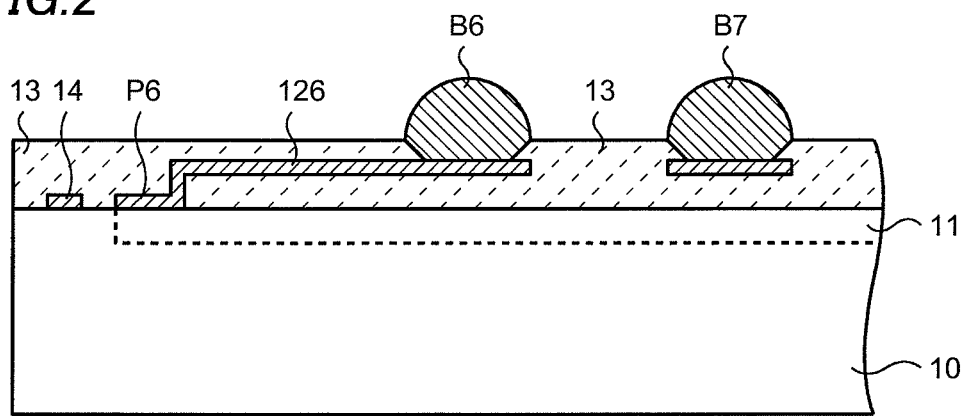
FIG. 2 is a cross-sectional view showing a section X-X in FIG. 1.

FIG. 1 is a plan view of a semiconductor integrated circuit 100 according to a first embodiment of this invention. FIG. 2 is a cross-sectional view of a section X-X shown in FIG. 1. The semiconductor integrated circuit 100 is a WLP structured to include a semiconductor substrate 10, a circuit region 11, re-distribution wirings 121-128, a resin layer 13, a peripheral wiring 14, a detection circuit 15, a resistor R2, pad electrodes P1-P8 and bump electrodes B1-B8.

The circuit region 11 is formed in a surface of the semiconductor substrate 10 through a semiconductor wafer process. The pad electrodes P1-P8 are formed on the surface of the semiconductor substrate 10 along its periphery, and are connected to various kinds of circuit blocks included in the circuit region 11. Each of the re-distribution wirings 121-128 is formed so as to extend over the surface of the semiconductor substrate 10, and is connected to corresponding each of the pad electrodes P1-P8.

The resin layer 13 covers the semiconductor substrate 10 over which the re-distribution wirings 121-128 are formed. An end portion of each of the re-distribution wirings 121-128 is shaped in a circle. An opening is formed in a resin layer 13 on the circle-shaped end portion. Each of the bump electrodes B1-B8 is formed on and connected to the circle-shaped end portion of corresponding each of the re-distribution wirings 121-128 through the opening in the resin layer 13. That is, the bump electrodes B1-B8 are arrayed on the circuit region 11 in the semiconductor substrate 10 as a BGA (Ball Grid Array).

The peripheral wiring 14 is disposed along four peripheries of the semiconductor substrate 10 outside the circuit region 11 and the pad electrodes P1-P8, as seen from the plan view of FIG. 1. The peripheral wiring 14 is formed on the semiconductor substrate 10, and is made of a metal layer that is the same as or different from a metal layer forming the pad electrodes P1-P8, or a polysilicon layer. A power supply electric potential Vcc is applied to a first end of the peripheral wiring 14, while a ground electric potential Vss is applied to a second end of the peripheral wiring 14 through the resistor R2. The detection circuit 15 is connected to a connecting node N1 between the peripheral wiring 14 and the resistor R2, and is structured to generate an anomaly detection signal ERRFLG based on an electric potential at the connecting node N1.

Figure 3:
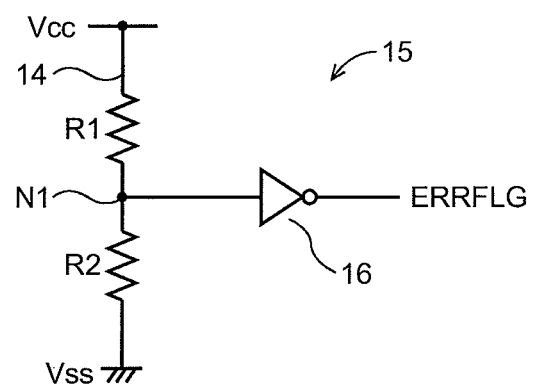
FIG. 3 is a circuit diagram of a first detection circuit in the semiconductor integrated circuit according to the first embodiment of this invention.

FIG. 3 is a circuit diagram showing an example structure of the detection circuit 15. The peripheral wiring 14 has a resistor R1 that is connected with the resistor R2 in series between the power supply electric potential Vcc and the ground electric potential Vss. The connecting node N1 between the peripheral wiring 14 and the resistor R2 is connected to an input terminal of an inverter 16. The anomaly detection signal ERRFLG is obtained from an output terminal of the inverter 16. In this case, a resistance of the resistor R2 is set to be larger than a normal resistance of the resistor R1 of the peripheral wiring 14, so that the electric potential at the node N1 between the peripheral wiring 14 and the resistor R2 in a normal state, in which there is no disconnection, is higher than a threshold electric potential of the inverter 16, which is $(1/2) \cdot Vcc$, for example. Therefore, an output of the inverter 16 is at an L level when the peripheral wiring 14 is in the normal state.

There are cases in which the semiconductor integrated circuit 100 is damaged in handling or in mounting it onto a circuit board to cause a defect such as chipping or cracking of the semiconductor substrate 10 or separation of the resin layer 13, which induces a stress in the peripheral wiring 14 to cause disconnection of the peripheral wiring 14 or abnormal increase in the resistance of the resistor R1.

In the case where the peripheral wiring 14 is disconnected, the electric potential at the connecting node N1 becomes the L level (Vss) and the output of the inverter 16 becomes an H level (Vcc), since the resistance of the resistor R1 becomes infinitely large. Also in the case where the resistance of the resistor R1 is abnormally increased although the peripheral wiring 14 is not disconnected, the output of the inverter 16 becomes the H level (Vcc) if the electric potential at the connecting node N1 becomes lower than the threshold electric potential of the inverter 16. The H level output of the inverter 16 makes the anomaly detection signal ERRFLG. In the case where the peripheral wiring 14 is in the normal state, the output of the inverter 16 is at the L level as described above. Therefore, whether the semiconductor integrated circuit 100 has the defect that causes the disconnection or the abnormal increase in the resistance of the peripheral wiring 14 can be detected based on the output of the inverter 16.

Figure 4:
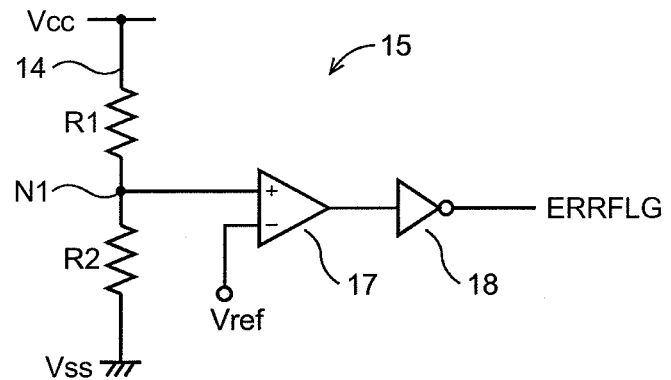
FIG. 4 is a circuit diagram of a second detection circuit in the semiconductor integrated circuit according to the first embodiment of this invention.

FIG. 4 is a circuit diagram showing another example structure of the detection circuit 15. The detection circuit 15 is structured to include a comparator 17 and an inverter 18. The electric potential at the connecting node N1 between the peripheral wiring 14 and the resistor R2 is applied to a positive input terminal (+) of the comparator 17. A reference electric potential Vref is applied to a negative input terminal (−) of the comparator 17.

In this case, the resistance of the resistor R2 is set so that the electric potential at the connecting node N1 is higher than the reference electric potential Vref of the comparator 17 in the normal state in which there is no disconnection. In the case where the reference electric potential $Vref=(1/2) \cdot Vcc$, the resistance of the resistor R2 is set to satisfy an inequality; (resistance of the resistor R2)>(normal resistance of the resistor R1). In the case where the reference electric potential $Vref=(1/5) \cdot Vcc$, the resistance of the resistor R2 is set to satisfy an inequality; (resistance of the resistor R2)>(1/4)·(normal resistance of the resistor R1). Therefore, an output of the comparator 17 is at the H level and an output of the inverter 18 is at the L level when the peripheral wiring 14 is in the normal state.

In the case where the peripheral wiring 14 is disconnected, the electric potential at the connecting node N1 becomes the L level, the output of the comparator 17 becomes the L level and the output of the inverter 18 becomes the H level, since the resistance of the resistor R1 is infinitely large. Also in the case where the resistance of the resistor R1 is abnormally increased although the peripheral wiring 14 is not disconnected, the output of the comparator 17 becomes the L level and the output of the inverter 18 becomes the H level if the electric potential at the connecting node N1 is lower than the reference electric potential Vref of the comparator 17. The H level output of the inverter 18 makes the anomaly detection signal ERRFLG. Therefore, whether the semiconductor integrated circuit 100 has the defect that causes the disconnection or the abnormal increase in the resistance of the peripheral wiring 14 can be detected based on the output of the inverter 18.

The defect such as the chipping or cracking of the semiconductor substrate 10 or the separation of the resin layer 13 can be electrically detected with the detection circuit 15, as described above. A structure to halt a certain circuit in the semiconductor integrated circuit 100 using the anomaly detection signal ERRFLG of the detection circuit 15 is hereafter described.

Figure 5:
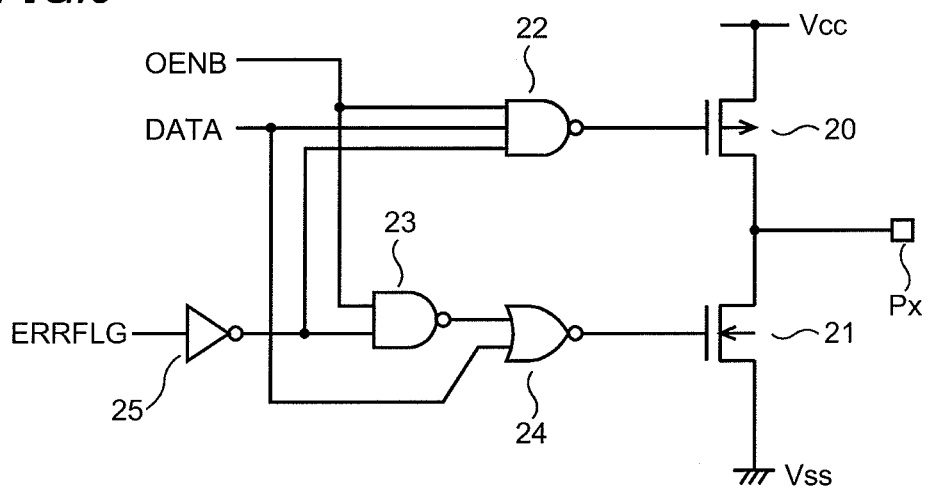
FIG. 5 is a circuit diagram of an output circuit in the semiconductor integrated circuit according to the first embodiment of this invention.

First, there is explained a structure to halt an output circuit in the semiconductor integrated circuit 100 based on the anomaly detection signal ERRFLG. FIG. 5 is a circuit diagram of the output circuit in the semiconductor integrated circuit 100. The output circuit is formed in the circuit region 11 in the semiconductor integrated circuit 100, and is structured to include a P channel type MOS transistor 20, an N channel type MOS transistor 21, NAND circuits 22 and 23, a NOR circuit 24 and an inverter 25.

The inverter 25 inverts a logic level of the anomaly detection signal ERRFLG from the detection circuit 15. Data DATA from a circuit in the circuit region 11, an output enable signal OENB and an inversion of the anomaly detection signal ERRFLG generated by the inverter 25 are applied to three input terminals of the NAND circuit 22, respectively. An output of the NAND circuit 22 is applied to a gate of the P channel type MOS transistor 20.

The output enable signal OENB and the inversion of the anomaly detection signal ERRFLG generated by the inverter 25 are applied to two input terminals of the NAND circuit 23, respectively. An output of the NAND circuit 23 is applied to an input terminal of the NOR circuit 24. The output of the NAND circuit 23 and the data DATA from the circuit in the circuit region 11 are applied to two input terminals of the NOR circuit 24, respectively. An output of the NOR circuit 24 is applied to a gate of the N channel type MOS transistor 21. The NAND circuits 22 and 23 and the NOR circuit 24 constitute an output control circuit.

The P channel type MOS transistor 20 and the N channel type MOS transistor 21 are connected in series between the power supply electric potential Vcc and the ground electric potential Vss. A connecting node between the P channel type MOS transistor 20 and the N channel type MOS transistor 21 is connected to a pad electrode Px. An output signal of the output circuit is obtained from the pad electrode Px. The pad electrode Px represents each of the pad electrodes P1-P8.

When the anomaly detection signal ERRFLG is at the H level (when the anomaly is detected), the output of the NAND circuit 22 is fixed at the H level and the output of the NOR circuit 24 is fixed at the L level, regardless of values of the output enable signal OENB and the data DATA. As a result, the P channel type MOS transistor 20 and the N channel type MOS transistor 21 are turned off. That is, the output circuit is not placed in operation and the data DATA is not outputted.

When the anomaly detection signal ERRFLG is at the L level (when the anomaly is not detected), the output circuit makes a normal operation. That is, it is placed in an output enable state when the output enable signal OENB is at the H level. When the data DATA is at the H level, the P channel type MOS transistor 20 is turned on and the N channel type MOS transistor 21 is turned off so that the output of the output circuit is turned to the H level. When the data DATA is at the L level, on the other hand, the P channel type MOS transistor 20 is turned off and the N channel type transistor 21 is turned on so that the output of the output circuit is turned to the L level.

Since the output circuit halts its operation when the anomaly detection signal ERRFLG is at the H level (when the anomaly is detected) as described above, the semiconductor integrated circuit 100 is judged to have a functional failure at the circuit function test before shipping. Therefore, it is made possible to control so that the semiconductor integrated circuit 100 having the defect such as the chipping of the die or separation of the resin is prevented from being shipped to the end customer.

Figure 6:
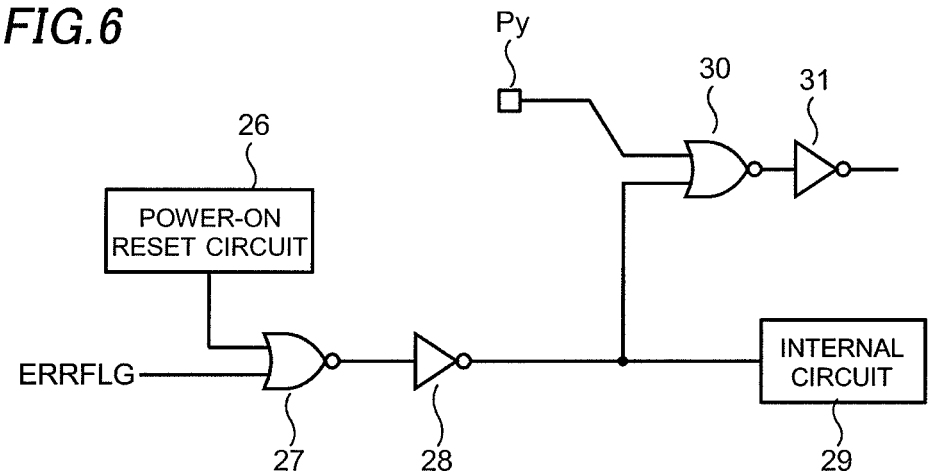
FIG. 6 is a circuit diagram of a first reset circuit in the semiconductor integrated circuit according to the first embodiment of this invention.

Next, there is explained a structure to reset an internal circuit in the circuit region 11 in the semiconductor integrated circuit 100 based on the anomaly detection signal ERRFLG. FIG. 6 is a circuit diagram of a reset circuit. The reset circuit is formed in the circuit region 11 in the semiconductor integrated circuit 100, and is structured to include a power-on reset circuit 26, a NOR circuit 27, an inverter 28, an internal circuit 29, a NOR circuit 30 and an inverter 31.

The power-on reset circuit 26 detects rising of the power supply electric potential Vcc at power-on of the semiconductor integrated circuit 100, and generates a power-on reset signal. The power-on reset signal from the power-on reset circuit 26 and the anomaly detection signal ERRFLG from the detection circuit 15 are applied to two input terminals of the NOR circuit 27, respectively.

An output of the NOR circuit 27 is applied to the internal circuit 29 and the NOR circuit 30 through the inverter 28. An input signal from a pad electrode Py and an output of the inverter 28 are applied to two input terminals of the NOR circuit 30, respectively. The pad electrode Py represents each of the pad electrodes P1-P8. An output of the NOR circuit 30 is applied to an input circuit (not shown) in the circuit region 11 through the inverter 31. The NOR circuit 27 constitutes an operation halt signal generation circuit that generates an operation halt signal (reset signal).

In the case where the anomaly detection signal ERRFLG is at the H level (when the anomaly is detected), the output of the NOR circuit 27 is forcibly fixed at the L level regardless of whether the power-on reset signal is generated. As a result, the output of the inverter 28 is turned to the H level. The internal circuit 29 is reset (operation is halted) by the H level output (reset signal) of the inverter 28. At that time, the output of the NOR circuit 30 is also forcibly fixed at the L level. With this, the input signal from the pad electrode Py is disabled.

In the case where the anomaly detection signal ERRFLG is at the L level (when the anomaly is not detected), the internal circuit 29 is reset and the input signal from the pad electrode Py is disabled when the power-on reset signal from the power-on reset circuit 26 is generated. The input signal from the pad electrode Py is enabled when the power-on reset signal from the power-on reset circuit 26 is not generated.

Since the internal circuit 29 is reset and the input signal from the pad electrode Py is disabled in the case where the anomaly detection signal ERRFLG is at the H level (when the anomaly is detected) as described above, the semiconductor integrated circuit 100 is judged to have a functional failure at the circuit function test before shipping. Therefore, it is made possible to control so that the semiconductor integrated circuit 100 having the defect such as the chipping of the die or separation of the resin is prevented from being shipped to the end customer.

Figure 7:
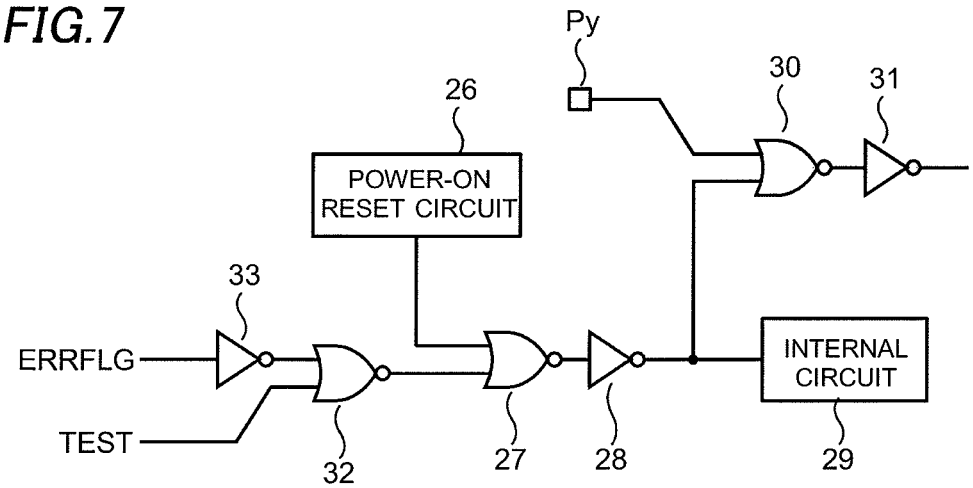
FIG. 7 is a circuit diagram of a second reset circuit in the semiconductor integrated circuit according to the first embodiment of this invention.

FIG. 7 is a circuit diagram of another reset circuit. The reset circuit has a function to disable the anomaly detection signal ERRFLG at failure analysis of the semiconductor integrated circuit 100 so that the failure analysis of the semiconductor integrated circuit 100 can be performed.

The reset circuit of FIG. 7 is provided with a NOR circuit 32 and an inverter 33 in a preceding stage of the NOR circuit 27 in the reset circuit of FIG. 6. The inverter 33 inverts the logic level of the anomaly detection signal ERRFLG. A test signal TEST and the inversion of the anomaly detection signal ERRFLG are applied to two input terminals of the NOR circuit 32, respectively. An output of the NOR circuit 32 is inputted to the NOR circuit 27.

In this case, the NOR circuit 32 constitutes a control circuit controlling so that the reset signal is not generated when the test signal TEST for the failure analysis is applied. That is, the H level of the test signal TEST is applied to the NOR circuit 32 when the failure analysis of the semiconductor integrated circuit 100 is to be performed. Then, the output of the NOR circuit 32 is fixed at the L level regardless of the anomaly detection signal ERRFLG. Then, the anomaly detection signal ERRFLG is disabled so that the internal circuit 29 is not reset and the input signal from the pad electrode Py is enabled.

As a result, it is made possible to perform the function test of the internal circuit 29 and the like in the semiconductor integrated circuit 100 even when the anomaly detection signal ERRFLG is at the H level, and it is made possible to analyze the cause of the failure of the semiconductor integrated circuit 100 that is judged to have the functional failure at the circuit function test. That is, it is made possible that the anomaly detection signal ERRFLG is disabled and the internal circuit 29 is put into operation for testing by applying the test signal TEST for the failure analysis. Otherwise, it is not known whether the internal circuit 29 operates correctly or not, since the internal circuit 29 is reset when the anomaly detection signal ERRFLG is at the H level (when the anomaly is detected).

[Second Embodiment]

Figure 8:
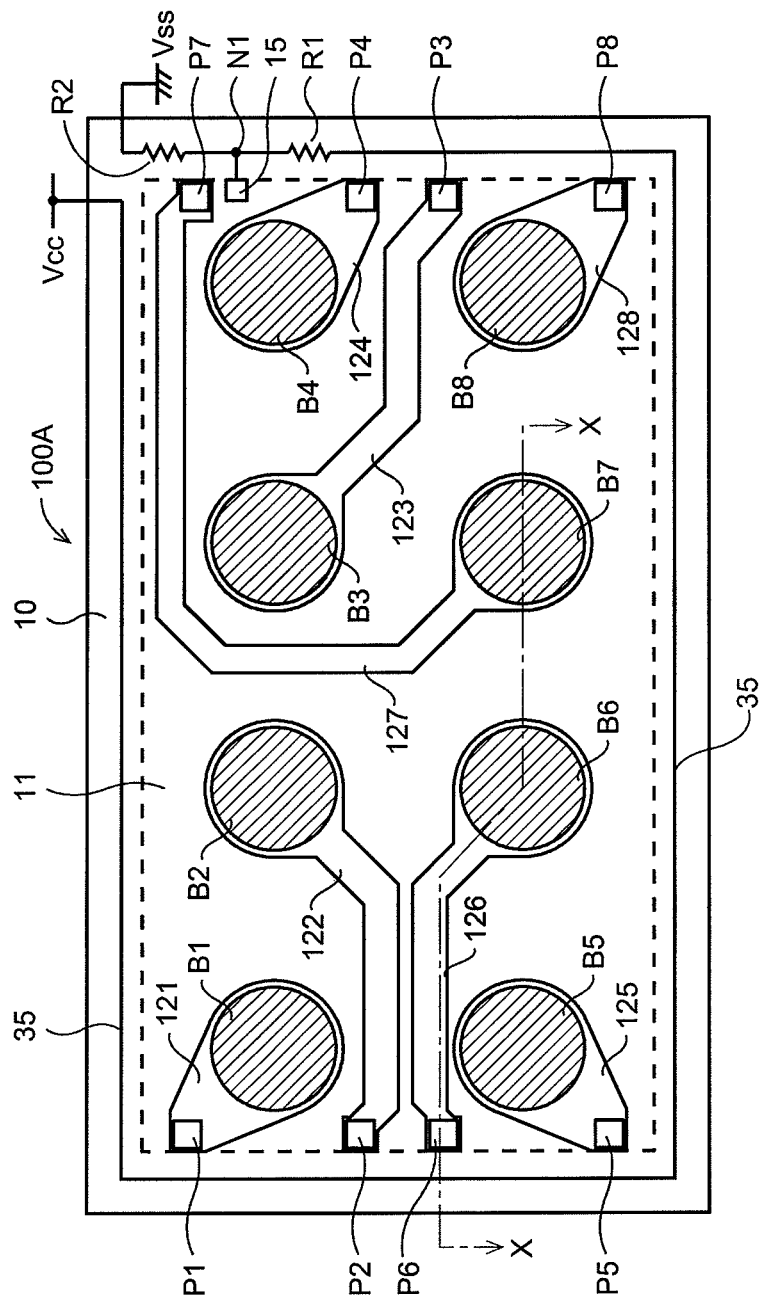
FIG. 8 is a plan view showing a semiconductor integrated circuit according to a second embodiment of this invention.
Figure 9:
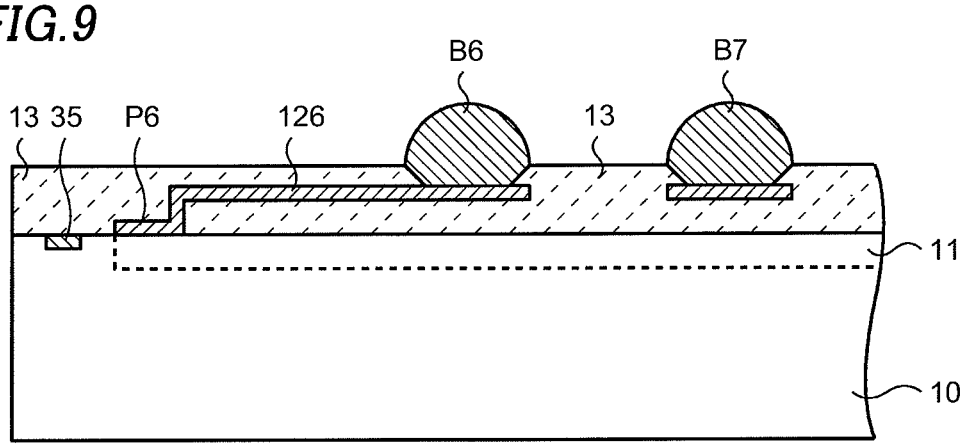
FIG. 9 is a cross-sectional view showing a section X-X in FIG. 8.

FIG. 8 is a plan view of a semiconductor integrated circuit 100A according to a second embodiment of this invention. FIG. 9 is a cross-sectional view of a section X-X shown in FIG. 8. While the peripheral wiring 14 in the semiconductor integrated circuit 100 according to the first embodiment is foamed on the semiconductor substrate 10, a peripheral wiring 35 in the semiconductor integrated circuit 100A according to the second embodiment is formed of a diffusion layer that is diffused into the semiconductor substrate 10, although the peripheral wiring 35 looks identical to the peripheral wiring 14 in the plan view. The diffusion layer can be formed through the wafer process at the same time as diffusion layers constituting devices in the circuit region 11 are formed. Other structures are the same as those in the first embodiment.

That is, the peripheral wiring 35 is disposed along four peripheries of the semiconductor substrate 10 outside the circuit region 11 and the pad electrodes P1-P8, as seen from the plan view of FIG. 8. The power supply electric potential Vcc is applied to a first end of the peripheral wiring 35, while the ground electric potential Vss is applied to a second end of the peripheral wiring 35 through the resistor R2.

In the semiconductor integrated circuit 100A according to the second embodiment also, whether the semiconductor integrated circuit 100A has the defect such as the chipping or cracking of the semiconductor substrate 10 or the separation of the resin layer 13 that causes the disconnection or the abnormal increase in the resistance of the peripheral wiring 35 can be detected by the detection circuit 15.

Since the peripheral wiring 35 is formed in the semiconductor substrate 10 in the semiconductor integrated circuit 100A according to the second embodiment, it has high sensitivity to detect the chipping or cracking of the semiconductor substrate 10. That is because the disconnection or increase in the resistance of the peripheral wiring 35 is readily induced when the chipping or cracking of the semiconductor substrate 10 occurs.

Although it is preferable for detecting the defect that the peripheral wiring 14 or 35 is disposed along the four peripheries of the semiconductor substrate 10 as described in the first and second embodiments, a certain degree of effect in detecting the defect can be expected even when it is disposed along only one, two or three peripheries of the semiconductor substrate 10.

With the semiconductor integrated circuit according to each of the embodiments of this invention, whether the WLP has the defect such as the chipping or cracking of the die or separation of resin can be electrically detected. As a result, it is made possible to control so that the WLP having such kind of defect is prevented from being shipped to the end customer.

What is claimed is:

1. A semiconductor integrated circuit comprising:
   a semiconductor substrate;
   a circuit region formed in a surface of the semiconductor substrate;
   a pad electrode formed on the surface of the semiconductor substrate and connected with a circuit in the circuit region;
   a re-distribution wiring formed on the surface of the semiconductor substrate and connected to the pad electrode;
   a resin layer formed on the surface of the semiconductor substrate so as to cover the re-distribution wiring;
   a protruded electrode connected to the re-distribution wiring through an opening in the resin layer;
   a peripheral wiring having a first end and a second end and disposed along a periphery of the semiconductor substrate outside the circuit region, a first electric potential being applied to the first end;
   a resistor connected between the second end of the peripheral wiring and a second electric potential; and
   a detection circuit generating an anomaly detection signal based on an electric potential at a connecting node between the peripheral wiring and the resistor.

2. The semiconductor integrated circuit of claim 1, further comprising an output transistor outputting a data signal from a circuit in the circuit region, and an output control circuit disabling outputting of the data signal from the output transistor in accordance with the anomaly detection signal generated by the detection circuit.

3. The semiconductor integrated circuit of claim 1, further comprising an operation halt signal generation circuit generating an operation halt signal to halt an operation of the circuit in the circuit region in accordance with the anomaly detection signal generated by the detection circuit.

4. The semiconductor integrated circuit of claim 3, further comprising a control circuit controlling the operation halt signal generation circuit so that the operation halt signal is not generated.

5. The semiconductor integrated circuit of claim 1, wherein the detection circuit comprises an inverter, an input terminal of the inverter being connected to the connecting node.

6. The semiconductor integrated circuit of claim 1, wherein the detection circuit comprises a comparator having a first input terminal and a second input terminal, the connecting node being connected to the first input terminal and a reference electric potential being applied to the second input terminal.

7. The semiconductor integrated circuit of claim 1, wherein the peripheral wiring is made of a metal wiring or a polysilicon wiring disposed on the surface of the semiconductor substrate.

8. The semiconductor integrated circuit of claim 1, wherein the peripheral wiring is made of a diffusion layer formed in the surface of the semiconductor substrate.

* * * * *